US006846423B1

(12) United States Patent
Miller et al.

(10) Patent No.: US 6,846,423 B1
(45) Date of Patent: Jan. 25, 2005

(54) WAFER-LEVEL SEAL FOR NON-SILICON-BASED DEVICES

(75) Inventors: Gregory D. Miller, Foster City, CA (US); Mike Bruner, Saratoga, CA (US)

(73) Assignee: Silicon Light Machines Corporation, Sunnyvale, CA (US)

( * ) Notice: Subject to any disclaimer, the term of this patent is extended or adjusted under 35 U.S.C. 154(b) by 176 days.

(21) Appl. No.: 10/231,357

(22) Filed: Aug. 28, 2002

(51) Int. Cl.[7] .......................... H01L 21/54; H01L 41/22
(52) U.S. Cl. ............................... 216/2; 216/41; 216/56; 29/25.35; 29/609.1; 438/25; 438/106
(58) Field of Search ............................... 216/2, 41, 56; 29/25.35, 609.1; 438/25, 106

(56) References Cited

U.S. PATENT DOCUMENTS

| | | | |
|---|---|---|---|
| 5,712,523 A | 1/1998 | Nakashima et al. | |
| 5,747,857 A | 5/1998 | Eda et al. | |
| 5,747,874 A | 5/1998 | Seki et al. | |
| 5,760,522 A | 6/1998 | Kobayashi et al. | |
| 5,777,422 A | 7/1998 | Kitabayashi et al. | |
| 5,786,738 A | 7/1998 | Ikata et al. | |
| 5,831,369 A | 11/1998 | Furbacher et al. | |
| 5,859,473 A | 1/1999 | Ikata et al. | |
| 5,872,331 A | 2/1999 | Ando et al. | |
| 5,991,989 A | 11/1999 | Onishi et al. | |
| 6,018,211 A | 1/2000 | Kanaboshi et al. | |
| 6,022,759 A | 2/2000 | Seki et al. | |
| 6,078,608 A | 6/2000 | Ohtsuka et al. | |
| 6,105,226 A | 8/2000 | Gore et al. | |
| 6,115,592 A | 9/2000 | Ueda et al. | |
| 6,136,175 A | 10/2000 | Stelzl et al. | |
| 6,265,807 B1 | 7/2001 | Koga et al. | |
| 6,310,420 B1 | 10/2001 | Pahl et al. | |
| 6,377,137 B1 | 4/2002 | Ruby | |
| 6,388,545 B1 | 5/2002 | Kawachi et al. | |
| 6,413,852 B1 * | 7/2002 | Grill et al. .................. 438/619 |
| 6,414,415 B1 | 7/2002 | Shibutani et al. | |
| 6,417,574 B1 | 7/2002 | Misawa et al. | |
| 6,426,583 B1 | 7/2002 | Onishi et al. | |
| 6,437,412 B1 | 8/2002 | Higuchi et al. | |
| 6,446,316 B1 | 9/2002 | Furbacher et al. | |
| 6,449,828 B2 | 9/2002 | Pahl et al. | |
| 6,455,980 B1 | 9/2002 | Bernstein | |
| 6,456,172 B1 | 9/2002 | Ishizaki et al. | |
| 6,498,422 B1 | 12/2002 | Hori | |
| 6,509,623 B2 | 1/2003 | Zhao | |
| 6,519,822 B1 | 2/2003 | Stelzl et al. | |
| 6,528,924 B1 | 3/2003 | Stelzl et al. | |
| 6,550,664 B2 | 4/2003 | Bradley et al. | |
| 6,570,469 B2 | 5/2003 | Yamada et al. | |
| 6,573,121 B2 | 6/2003 | Yoneda et al. | |
| 6,573,635 B2 | 6/2003 | Suga et al. | |
| 6,666,371 B2 | 12/2003 | Nakazawa et al. | |
| 2001/0010444 A1 | 8/2001 | Pahl et al. | |
| 2002/0171121 A1 * | 11/2002 | Ozgur ........................ 257/532 |
| 2003/0155643 A1 * | 8/2003 | Friedhoff .................... 257/704 |
| 2003/0159262 A1 * | 8/2003 | Pasternak et al. ............. 29/262 |
| 2003/0193269 A1 | 10/2003 | Jang et al. | |
| 2003/0224557 A1 * | 12/2003 | Koduri et al. .............. 438/110 |

OTHER PUBLICATIONS

PCT International Search Report mailed Mar. 26, 2004 (4 sheets).
Danny King, et al. "SAW filters in CDMA mobile communication networks", Wireless Technologies China 1999. Conference Proceedings, pp. 104–107; Sawtek, Inc.

* cited by examiner

*Primary Examiner*—Allan Olsen
(74) *Attorney, Agent, or Firm*—Okamoto & Benedicto LLP (57) ABSTRACT

One embodiment disclosed relates to a method for sealing an active area of a non-silicon-based device on a wafer. The method includes providing a sacrificial material over at least the active area of the non-silicon-based device, depositing a seal coating over the wafer so that the seal coating covers the sacrificial material, and replacing the sacrificial material with a target atmosphere. Another embodiment disclosed relates to a non-silicon-based device sealed at the wafer level (i.e. prior to separation of the die from the wafer). The device includes an active area to be protected, a contact area, and a lithographically-formed structure sealing at least the active area and leaving at least a portion of the contact area exposed.

19 Claims, 6 Drawing Sheets

WAFER-LEVEL SEAL FOR NON-SILICON-BASED DEVICES

REFERENCE TO RELATED APPLICATION

The present application is related to "Seal for Surface Acoustic Wave Devices," filed on the same date herewith, by inventors Gregory D. Miller, Mike Bruner, Lawrence Ragan, and Gary Green (Ser. No. 10/231,356).

BACKGROUND OF THE INVENTION

1. Field of the Invention

The present invention relates generally to integrated circuits, and more particularly to integrated circuit fabrication processes and structures.

2. Description of the Background Art

Various non-silicon-based devices are being manufactured for use in communications and other applications. Such devices are often sensitive to contamination or to the atmosphere in which they operate, and hence it is desirable for them to operate in a controlled atmosphere. Examples of these atmosphere-sensitive non-silicon-based devices include surface acoustic wave (SAW) devices, electro-optic modulators, acoustic-optic devices, and so on.

For example, let us consider SAW devices in more detail. SAW devices are often used in communication devices, such as, for instance, radio frequency (RF) filters in mobile phone handsets and communication networks. SAW devices utilize waves that propagate along the surface (or near surface) of a substrate. As used herein, SAW devices include those that utilize piezoelectrically-coupled Rayleigh waves and may also include those that utilize non-Rayleigh (skimming or "leaky") waves. A typical SAW filter includes input and output transducers formed on a non-silicon-based piezoelectric substrate, such as, for example, lithium tantalate, lithium niobate, or single crystal quartz. The transducers may be metallic electrodes, for example, interleaved aluminum fingers. As an example of the size of a typical SAW device, one operating at 2.5 GHz may have a minimum feature size of approximately 0.4 microns for the aluminum fingers of the transducers.

One problem encountered with SAW devices is that the regions of the device where the acoustic waves are present can be very sensitive to the presence of surface contaminants that alter the wave velocities and consequently degrade the device performance. Even a monolayer of contaminant on the surface of the crystal can noticeably alter the device performance. Also, it is desirable for the SAW devices to operate in a low pressure (near vacuum) atmosphere, rather than in atmospheric air. Operating in such a low pressure atmosphere can decrease the viscous damping of the acoustic waves. Another problem associated with SAW devices is that a change in acoustic wave velocity is temperature dependent. In other words, a temperature change can change the velocity of the acoustic waves. This temperature dependence effectively limits the operable temperature range of SAW devices.

SUMMARY

One embodiment of the invention relates to a method for sealing an active area of a non-silicon-based device on a wafer. The method includes providing a sacrificial material over at least the active area of the non-silicon-based device, depositing a seal coating over the wafer so that the seal coating covers the sacrificial material, and replacing the sacrificial material with a target atmosphere.

Another embodiment of the invention relates to a non-silicon-based device sealed at the wafer level (i.e. prior to separation of the die from the wafer). The device includes an active area to be protected, a contact area, and a lithographically-formed structure sealing at least the active area and leaving at least a portion of the contact area exposed.

These and other features of the present invention will be readily apparent to persons of ordinary skill in the art upon reading the entirety of this disclosure, which includes the accompanying drawings and claims.

BRIEF DESCRIPTION OF THE DRAWINGS

FIGS. 1B, 1C, 1D, 1E, 1F, 1G, 1H and 1I are cross-sectional diagrams depicting various steps in the process of sealing the non-silicon-based device in accordance with an embodiment of the invention.

The use of the same reference label in different drawings indicates the same or like components. Drawings are not to scale unless otherwise noted.

DETAILED DESCRIPTION

The above described problems and difficulties with non-silicon-based devices may be overcome by controlling the atmosphere in which the devices operate.

One way to achieve this would be to seal the devices on the packaging level during packaging of the individual die. Seals may be formed, for example, in metal or ceramic packages. For instance, a metal package may be welded or soldered to seal it, and the individual leads may be sealed using separate glass seals to separate the leads from the metal. As another example, in ceramic packages, a metal seal band attached by glassy material may be used to facilitate the sealing by welding or soldering, and the leads may be embedded in the ceramic itself. Other types of packages and other sealing techniques at the packaging level may also be used.

As disclosed in detail in the present application, a different and advantageous way to control the atmosphere in which a non-silicon-based device operates is to fabricate a seal at the wafer level (i.e. prior to separation of the die from the wafer) using integrated circuit manufacturing technology. Fabricating a seal at the wafer level has various advantages over doing so at the packaging level.

One advantage is that the sealed non-silicon-based device on the die can be tested on the wafer prior to dicing. For example, current die sizes for SAW devices are typically in the 1 to 1.5 mm range so that about 6000 to 7000 die may be fabricated on a single four inch wafer. The wafer-level sealing of SAW devices allows for the identification and selection of devices that pass the acceptance testing before the die are separated from the wafer and so avoids the more cumbersome testing of individual die after the dicing and also avoids the subsequent packaging currently practiced.

In addition, a potential advantage is that the die so produced by sealing at the wafer level may be mountable on a printed circuit board (PCB) without further packaging. Such direct mounting onto a PCB may be possible because the non-silicon-based device is sealed at the wafer level during the fabrication process. Such direct mounting would avoid the additional costs and processing time associated with mounting in lead frames, wire bonding, and encapsulation. This may advantageously lead to production of the devices with higher quality, higher throughput, higher yield, and less expense.

Another potential advantage relates to compensating for thermal expansion of the non-silicon crystal. It is possible to compensate for thermal expansion by inducing a strain in the crystal using the seal structure. The structural design and material used for the wafer-level seal may be used to induce such a strain. The seal material would be chosen such that the material had a thermal coefficient-of-expansion (TCE) mismatch with the crystal. The structure would be designed so that the TCE mismatch would effectively produce a strain as a countervailing force against the normal thermal expansion of the crystal.

In the present disclosure, numerous specific details are provided such as examples of apparatus, process parameters, materials, process steps, and structures to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1A:
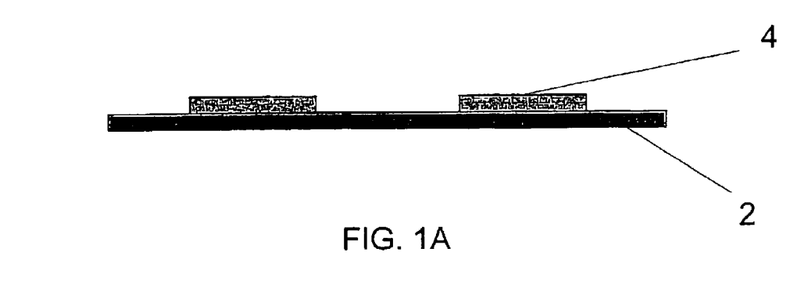
FIG. 1A is a cross-sectional diagram depicting an unsealed non-silicon-based device (in this instance, an SAW device) as fabricated on the surface of a wafer.

FIG. 1A is a cross-sectional diagram depicting an unsealed non-silicon-based device (in this instance, an SAW device) as fabricated on the surface of a wafer. The unsealed SAW device includes a substrate 2 and transducer structures 4 and may be fabricated using conventional techniques. The substrate 2 is typically a wafer of lithium tantalate, lithium niobate, or single crystal quartz. Such materials enable acoustic waves to travel substantially elastically across the surface of the substrate. The transducer structures 4 are typically comprised of aluminum patterned into interdigitated electrode "fingers" and contacts for conducting electrical current to and from the structures 4. Typically, one of the transducer structures is for input and the other is for output. Wave propagation of interest occurs on the surface of the substrate 2 within the transducer structures 4 themselves and in the area between the transducer structures 4. The SAW device may be used, for example, as a radio frequency (RF) filter. Many different device configurations may be used.

FIGS. 1B, 1C, 1D, 1E, 1F, 1G, 1H and 1I are cross-sectional diagrams depicting various steps in the process of sealing the non-silicon-based device in accordance with an embodiment of the invention.

Figure 1B:
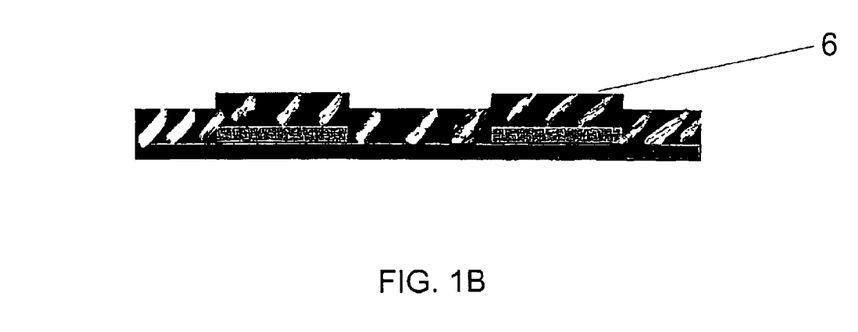

FIG. 1B is a cross-sectional diagram depicting the structure after the deposition of a sacrificial material 6. In one embodiment, the sacrificial material may be deposited as a (nearly) uniform coating of polysilicon. The use of polysilicon as the sacrificial material 6 has an advantage that the deposition can be used to increase either the bulk or surface conductivity of SAW materials such as lithium niobate or lithium tantalate. This is due to a chemical reduction process that is known to occur when these substrates are heated in vacuum. Also this chemical reduction process can occur at the interface between a readily-oxidized material such as silicon, thereby producing a thin skin of chemically reduced material having increased conductivity. This increased conductivity can be valuable in suppressing the build up of charge on these substantially insulating substrates which occurs due to a pyroelectric effect. Conventional lithium tantalate can build up thousands of volts of pyroelectrically-induced charge during temperature changes, and this built-up charge can potentially degrade the SAW performance through damage to the transducer structures or the formation of microscopic domains of reversed crystal orientation in the SAW active area, or can potentially damage sensitive electronic components or damage the wafer, even to the point of fracture (because the pyroelectrically-induced voltage may exceed the breakdown voltage of the wafer material). Consequently, using polysilicon sacrificial layers in fabricating SAW devices may result in devices with superior resistance to these deleterious pyroelectric effects.

In another embodiment, the sacrificial material may comprise amorphous silicon. Advantageously, amorphous silicon may be deposited at a lower temperature than polysilicon.

In yet another embodiment, the sacrificial material 6 may be a polymer material, such as polyimide, photoresist, or polymethyl methacrylate (PMMA). These polymer sacrificial materials may be attractive when low temperature processing is needed through the sealing process. However, they may have the following disadvantages: (a) difficulty of removing material from within a pocket with significant lateral dimensions due to the directional nature of plasma etching; (b) impurities that do not react and thereby leave a residue (may not be an issue with PMMA); and (c) formation of water molecules that adsorb to the surfaces inside the pocket and may prevent hermeticity due to the moisture.

The polysilicon may be deposited at temperatures around 550 degrees Celsius, below the Curie temperature of lithium tantalate, and therefore is a candidate material to use as the sacrificial material. Materials with deposition temperatures above the Curie temperature of the substrate (about 600 degrees Celsius for congruent lithium tantalate or about 695 degrees Celsius for stoichiometric lithium tantalate) would not make good candidates for use as the sacrificial material as their high temperatures would adversely affect the substrate material. Amorphous silicon can be deposited at temperatures as low as 150 degrees Celsius and also may be dry etched in a highly selective manner using xenon difluoride gas.

Figure 1C:
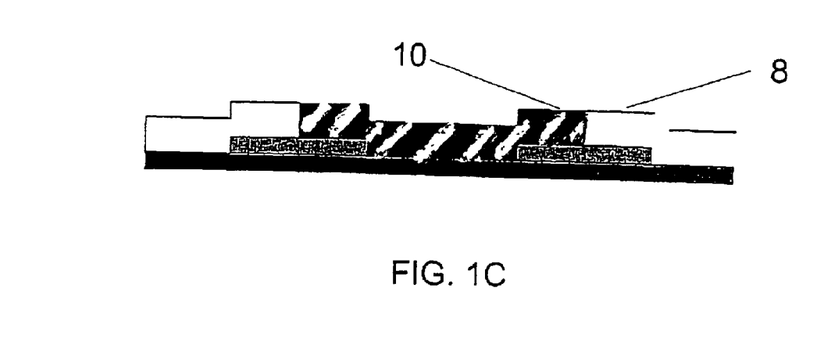

FIG. 1C is a cross-sectional diagram depicting the structure after lithographic patterning of the sacrificial material 6. The patterning removes undesired portions 8 of the sacrificial material while leaving remaining portions 10 of the sacrificial material. The remaining sacrificial material 10 covers the portion of the SAW device to be sealed. In particular, the remaining sacrificial material 10 should cover at least the wave propagation area of the SAW device because that area is to be kept clean of contamination. The wave propagation area is generally between the two transducer structures 4 (as shown in FIG. 1A) as well as internal to a substantial portion of those structures 4, so FIG. 1C illustrates the remaining sacrificial material 10 as covering both the area between the transducer structures 4 and the wave propagation regions internal to those structures 4.

Figure 1D:
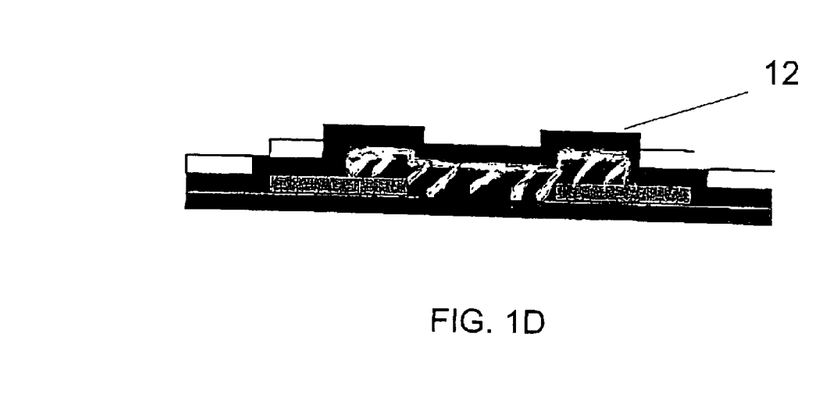

FIG. 1D is a cross-sectional diagram depicting the structure after deposition of a seal coating 12. The seal coating 12 may be deposited over the entire wafer and may comprise a relatively thick layer of, for example, a glassy material. The glassy material may be, for example, a spin-on-glass or a sputtered glass. The material may comprise silicon dioxide. Alternatively, the material may comprise silicon nitride or metal. The seal coating 12 should be of a material and thickness so as to be impermeable to undesired contaminants. The proximity and electrical characteristics of these coatings must be considered in the design of the SAW device.

Figure 1E:
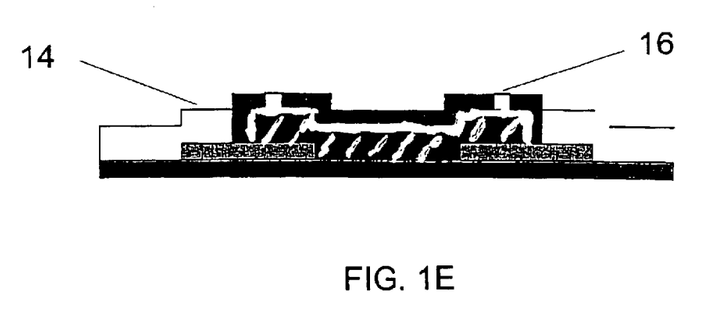

FIG. 1E is a cross-sectional diagram depicting the structure after lithographic patterning of the seal coating 12. The patterning removes portions 14 of the seal coating to expose the electrical contact pad portions of the transducers 4. In addition, the patterning removes portions 16 of the seal coating to create vias (holes) through the seal coating to the sacrificial material below. In a preferred embodiment, the vias are placed to avoid a wave propagation area of the SAW device.

Figure 1F:
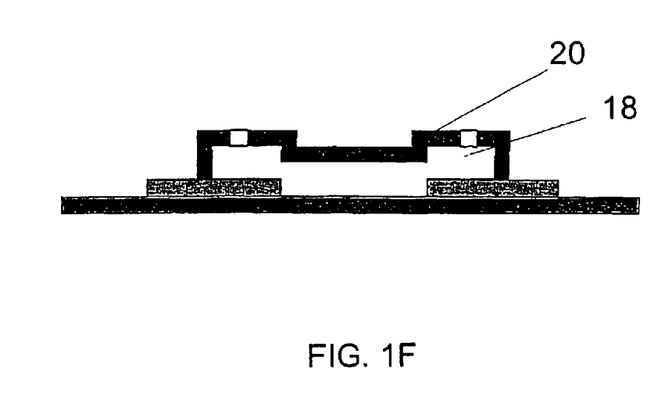

FIG. 1F is a cross-sectional diagram depicting the structure after etching away the remaining sacrificial material 10 by way of the via(s) to create a pocket 18 surrounded by a structure 20 of the seal coating. The etching may be done by a dry etching process that does not leave undesirable residue.

For example, in one embodiment, the etching of a polysilicon (or amorphous silicon) sacrificial material on, for example, a lithium tantalate (or lithium niobate) wafer with a sealing layer of silicon dioxide (or silicon nitride or metal) may be accomplished by placing the wafer in a xenon-difluoride atmosphere. The xenon-difluoride enters the vias and attacks the sacrificial material with high selectivity (i.e. leaving the substrate and sealing coating substantially un-etched). The xenon-difuoride also removes the sacrificial material without leaving a substantial residue on the surface of the wafer. Leaving the acoustically active portion of the surface residue free prevents adverse alterations to wave propagation characteristics of the device. A pocket is thereby formed between the seal coating structure 20 and the surface of the wafer in the region previously occupied by the remaining sacrificial material 10. Alternatively, a different gas with similar characteristics to xenon-difluoride may be used to dry etch the sacrificial material.

Figure 1G:
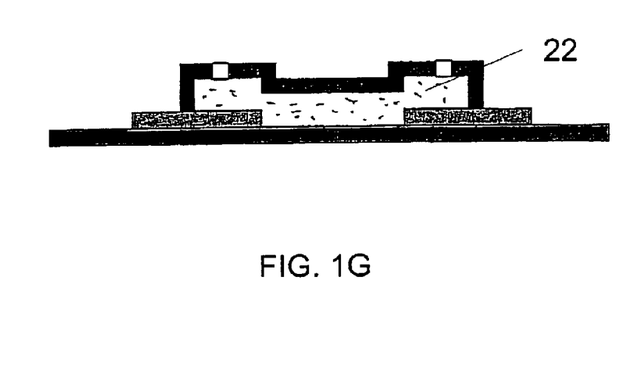

FIG. 1G is a cross-sectional diagram depicting the structure after the wafer is placed in a target atmosphere. This may be done by placing the wafer in a sputtering, evaporating or other vacuum chamber pumped down to a target atmosphere. The target atmosphere may comprise partial pressures of one or more target gases. The gas pressures in the chamber come to equilibrium across the vias 16 to attain the same gas pressures inside the pocket 22 as inside the chamber.

Figure 1H:
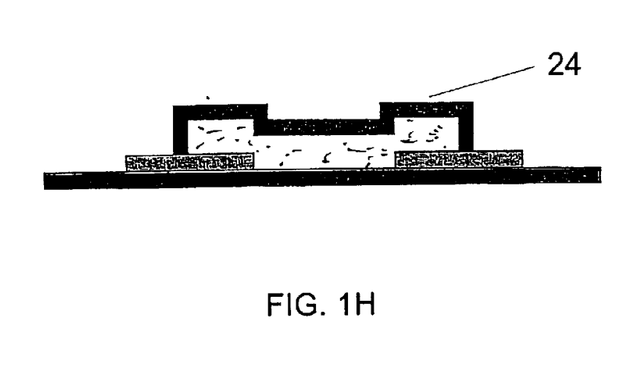

FIG. 1H is a cross-sectional diagram depicting the structure after filling the via(s) 16 to seal the target atmosphere 22 in the pocket. The vias (holes) 16 through the coating structure 20 may be filled 24, for example, by sputtering or evaporation of silicon dioxide or metal.

Sputtering, when configured to be isotropic in nature, will fill in the vias 16 by coating the rims of the holes and building up material from the rims until the vias 16 are sealed. The isotropic nature of sputtering will introduce some of the silicon dioxide or metal into the pocket. If the sputtered material lands on the region to be occupied by the surface acoustic wave, the propagation properties of the acoustic wave may be altered in a detrimental manner. To avoid this detrimental effect, the coating structure 20 may be designed such that the via(s) 16 are not over or are not in the vicinity of the wave propagation area. This is so that the amount of sputtered material that lands on the wave propagation area may be minimized or reduced to an insubstantial amount that only insignificantly affects the propagation of the surface acoustic waves.

Alternatively, evaporation may be used where the silicon dioxide or metal beam is positioned at an angle to the wafer. Evaporation tends to be highly directional in nature. By positioning the beam at a substantial angle to the wafer, the highly directional beam can fill 24 the vias 16 without introducing significant evaporated material into the pocket. An additional advantage of evaporation is that a higher vacuum may be achieved in an evaporation chamber in comparison to a sputtering chamber.

As depicted in FIG. 1H, the chosen gas and pressure are then locked into the pocket that is now sealed 24. This advantageously provides a controlled atmosphere for the acoustically active portion of the device and protects that portion from undesirable contamination. The sealed structure formed as described above should provide a hermetic seal. A hermetic seal is substantially airtight in that it substantially keeps air or gas from getting in or out. However, even for a hermetic seal, small gas molecules will pass through slowly over time through diffusion and permeation. The hermeticity of the seal can be substantially enhanced by coating it with a film of silicon nitride deposited using plasma-enhanced chemical vapor deposition (PECVD).

FIG. 1I is a cross-sectional diagram depicting the structure after electrodes (bumps) 26 have been formed on the contact portions of the transducer structures 4. The electrodes 26 may be formed using conventional lithographic techniques. As depicted in FIG. 1I, the electrodes 26 are formed to be of a height that is greater than the height of the sealing structure. This makes the sealed device suitable for surface-mount soldering.

Prior to mounting the sealed device onto the PCB board, the devices may be individually tested on the wafer and selected for acceptance or rejection. Thereafter, the wafer may be diced to produce individual die with the devices thereon. And the acceptable die may then be placed into a surface-mount-device tape-and-reel for subsequent surface-mount soldering onto a printed circuit board.

Figure 2:
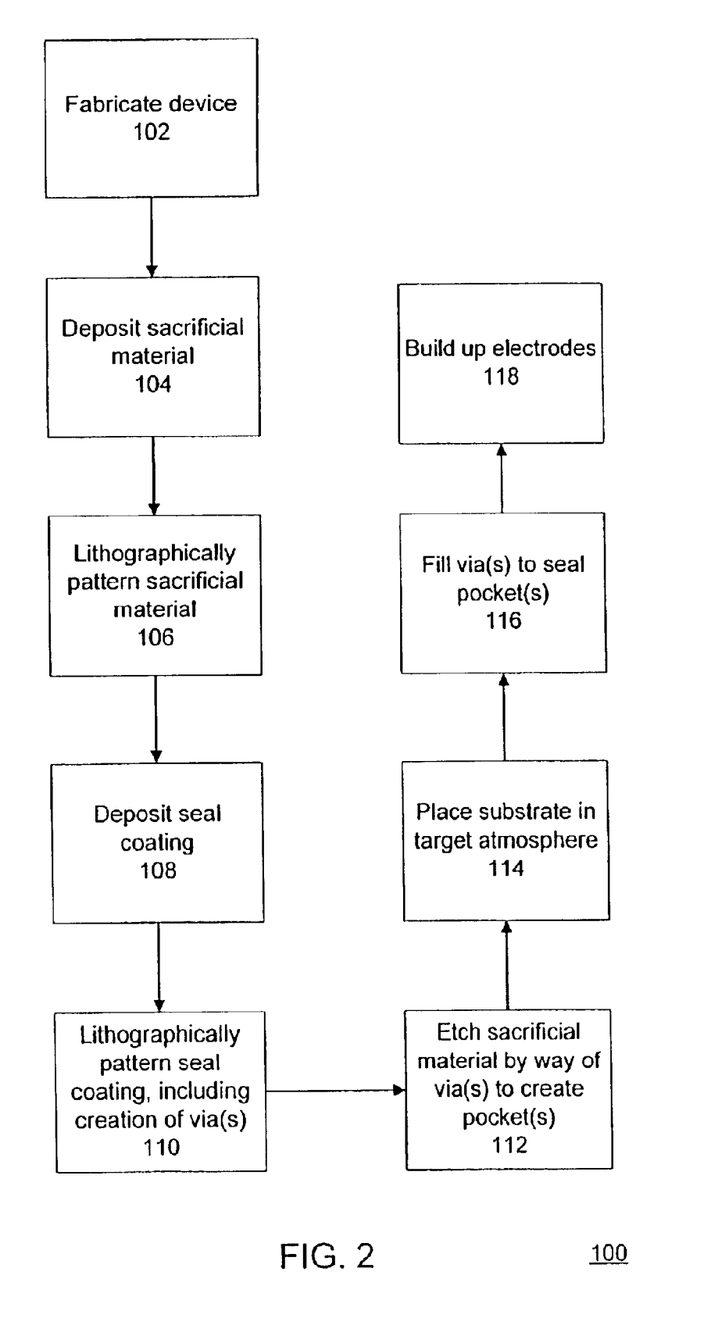
FIG. 2 is a flow chart depicting a method for sealing an active area of a non-silicon device (in this instance, a wave propagation area of a SAW device) on a wafer in accordance with an embodiment of the invention.

FIG. 2 is a flow chart depicting a method for sealing an active area of a non-silicon device (in this instance, a wave propagation area of a SAW device) on a wafer in accordance with an embodiment of the invention. As depicted in FIG. 2, the method 100 includes nine steps (102, 104, 106, 108, 110, 112, 114, 116, and 118).

In the first step 102, an unsealed device is fabricated on the wafer. A cross-section of a fabricated SAW device before being sealed is illustrated in FIG. 1A. As described in relation to FIG. 1A, the unsealed device may be fabricated using conventional techniques on substrates such as lithium tantalate, lithium niobate, or quartz.

In the second step 104, sacrificial material is deposited onto the wafer. A cross-section after deposition of the sacrificial layer is illustrated in FIG. 1B. As described in relation to FIG. 1B, the sacrificial layer may comprise polysilicon, or amorphous silicon, or possibly a polymeric material.

In the third step 106, the sacrificial layer is patterned using lithography. A cross-section after sacrificial layer patterning is illustrated in FIG. 1C. As described in relation to FIG. 1C, the remaining sacrificial material should cover at least the wave propagation area of the SAW device because that is the area to be sealed.

In the fourth step 108, the seal coating is deposited onto the wafer. A cross-section after seal coating deposition is illustrated in FIG. 1D. As described in relation to FIG. 1D, the seal coating may comprise a glassy material deposited by spin-on or sputtering. The material may comprise silicon dioxide. Alternatively, the material may comprise silicon nitride or metal.

In the fifth step 110, the seal layer is patterned using lithography. A cross-section after seal layer patterning is illustrated in FIG. 1E. As described in relation to FIG. 1E, the patterning exposes the electrical contact pad portions of the transducers 4. In addition, the patterning creates vias (holes) through the seal coating to the sacrificial material below.

In the sixth step 112, the sacrificial material may be etched by way of the vias to create a pocket above the device. A cross-section after etching the sacrificial material is illustrated in FIG. 1F. As described in relation to FIG. 1F, the etching may be done by a dry etching process that does not leave undesirable residue.

In the seventh step 114, the substrate is placed into a target atmosphere and allowed to equilibriate. A cross-section after placement in the target atmosphere is illustrated in FIG. 1G. As described in relation to FIG. 1G, the gas pressures in the chamber come to equilibrium across the vias to attain the same gas pressures inside the pocket as inside the chamber.

In the eighth step 116, the vias (holes) are filled to seal the pocket. This step is performed while the wafer is still in the target atmosphere. A cross-section after the vias are filled is illustrated in FIG. 1H. As described in relation to FIG. 1H, the vias may be filled, for example, by sputtering or evaporation of silicon dioxide or metal.

Finally, in the ninth step 118, electrodes 26 are built upon the contacts. A cross-section after the vias are filled is illustrated in FIG. 1I. As described in relation to FIG. 1I, the electrodes 26 are formed to be of a height that is greater than the height of the sealing structure so as to make the sealed device suitable for surface-mount soldering.

Subsequent to the ninth step 118, other steps may be performed to mount the device onto a printed circuit board (PCB). For example, the devices may be individually tested on the wafer, the wafer may be diced to produce individual die, and the acceptable die may then be placed into a surface-mount-device tape-and-reel for subsequent surface-mount soldering onto the PCB.

Although the above description focuses on a wafer-level seal for SAW devices, the technique may be applied to protect at the wafer level other devices employing non-silicon-based materials with an active area to protect. Such applications include a high dielectric strength vacuum insulation for domain patterning in ferroelectrics (such as lithium tantalate or lithium niobate), electro-optic modulators (for example, based as lithium tantalate or lithium niobate), and integrated optic structures. In each of these applications, non-silicon-based devices may be lithographically constructed to include a means for receiving a signal in electrical form, a means for applying the signal to an active area of the substrate, and a means for hermetically sealing the active area without impeding receiving of the electrical signal. For an SAW device, the active area to be protected would, of course, correspond to the wave propagation area. The technique may also be applicable to other near-surface devices. Near-surface devices include, for example, acoustic, optic, non-linear optic, electro-optic, acoustic-optic, and other devices.

While specific embodiments of the present invention have been provided, it is to be understood that these embodiments are for illustration purposes and not limiting. Many additional embodiments will be apparent to persons of ordinary skill in the art reading this disclosure. Thus, the present invention is limited only by the following claims.

What is claimed is:

1. A method for sealing an active area of a non-silicon-based device on a wafer, the method comprising:

depositing a sacrificial material over at least the active area of the non-silicon-based device;

depositing a seal coating over the wafer so that the seal coating covers the sacrificial material; and replacing the sacrificial material with a target atmosphere, wherein the non-silicon based device is formed on a non-silicon substrate, wherein, during the deposition of the sacrificial material, a chemical reduction occurs between the sacrificial material and the non-silicon substrate so as to result in increased conductivity of the non-silicon substrate.

2. The method of claim 1, wherein the seal coating is of a sufficient impermeability so as to hermetically seal the target atmosphere within a pocket.

3. The method of claim 1, further comprising:

lithographically patterning the sacrificial material so that the sacrificial material is over at least the active area of the non-silicon-based device.

4. The method of claim 1, wherein the sacrificial material comprises a material from a group of materials consisting of polysilicon, amorphous silicon, and polymeric material.

5. The method of claim 1, wherein the seal coating comprises a material from a group of materials consisting of silicon dioxide, silicon nitride, or metal.

6. The method of claim 1, wherein the seal coating comprises a glassy material.

7. The method of claim 6, wherein the glassy material is from a group of glassy materials consisting of spin-on-glass and sputtered glass.

8. The method of claim 1, wherein replacing the sacrificial material comprises:

lithographically patterning the seal coating to create a via through the seal coating and to expose electrical contact pads for the non-silicon-based device;

etching a sacrificial material by way of the via to create a pocket surrounded by the seal coating;

placing the wafer in the target atmosphere; and filling the via to seal the target atmosphere in the pocket.

9. The method of claim 8, wherein etching the sacrificial material comprises an etching process that does not leave substantial residue.

10. The method of claim 9, wherein the sacrificial material comprises a silicon-based material, and wherein the etching process comprises placing the wafer in a xenon-difluoride atmosphere to dry etch the silicon-based material.

11. The method of claim 8, further comprising:

allowing an atmosphere in the pocket to equilibrate with the target atmosphere prior to filling the via.

12. The method of claim 8, wherein filling the via comprises sputtering of a fill material until the via is filled, and wherein the via is placed to avoid the active area of the non-silicon-based device.

13. The method of claim 8, wherein filling the via comprises evaporating a fill material until the via is filled, and wherein an angle between evaporating beam and wafer surface is sufficiently low to avoid introducing a substantial amount of the fill material into the pocket.

14. The method of claim 1, further comprising:

building up electrodes connected to contact pads of the non-silicon-based device.

15. The method of claim 14, wherein the wafer is subsequently diced to produce individual die and acceptable die are placed into a surface-mount-device tape-and-reel for subsequent printed circuit board mounting.

16. The method of claim 1, wherein the active area comprises a wave propagation area of the non-silicon-based device.

17. The method of claim 1, wherein the non-silicon substrate comprises lithium tantalate.

18. The method of claim 1, wherein the non-silicon substrate comprises lithium niobate.

19. The method of claim 1, wherein the increased conductivity of the non-silicon substrate suppresses build-up of charge on the substrate during operation of the device.

* * * * *